(12) United States Patent
Bosshart

(10) Patent No.: US 8,650,529 B2
(45) Date of Patent: Feb. 11, 2014

(54) SYSTEM AND METHOD FOR INTEGRATED CIRCUIT LAYOUT EDITING WITH ASYMMETRIC ZOOM VIEWS

(75) Inventor: Patrick W. Bosshart, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 81 days.

(21) Appl. No.: 13/368,160

(22) Filed: Feb. 7, 2012

(65) Prior Publication Data

US 2013/0205274 A1 Aug. 8, 2013

(51) Int. Cl.
*G06F 17/50* (2006.01)

(52) U.S. Cl.
USPC .......................... 716/139; 716/110; 716/119

(58) Field of Classification Search
USPC .................. 716/100–102, 110, 118–119, 139
See application file for complete search history.

(56) References Cited

U.S. PATENT DOCUMENTS

2013/0061199 A1* 3/2013 Stellari et al. ................. 716/139

OTHER PUBLICATIONS

Kommuru et al., "ASIC Design Flow Tutorial Using Synopsys Tools", (San Francisco State University, 2009), available at http://userwww.sfsu.edu/~necrc/files/synopsys%20tutorials/ASIC%20Design%20Flow%20Tutorial.pdf, pp. 1-11, 92-102.

* cited by examiner

*Primary Examiner* — Paul Dinh
(74) *Attorney, Agent, or Firm* — John R. Pessetto; Wade J. Brady, III; Frederick J. Telecky, Jr.

(57) ABSTRACT

An automated system, and method of operating the same, for assisting the layout of components and the routing of conductors in a layout of an integrated circuit. An asymmetric zoom command is provided, by way of which the user can magnify the current view of a portion of the layout in one dimension while maintaining the original magnification in the orthogonal dimension. The commands can be conveyed by keystrokes, or by a command in combination with a drawn rectangle indicating the extent of the asymmetric zoom magnification. Both asymmetric zoom-in and asymmetric zoom-out are supported.

23 Claims, 7 Drawing Sheets

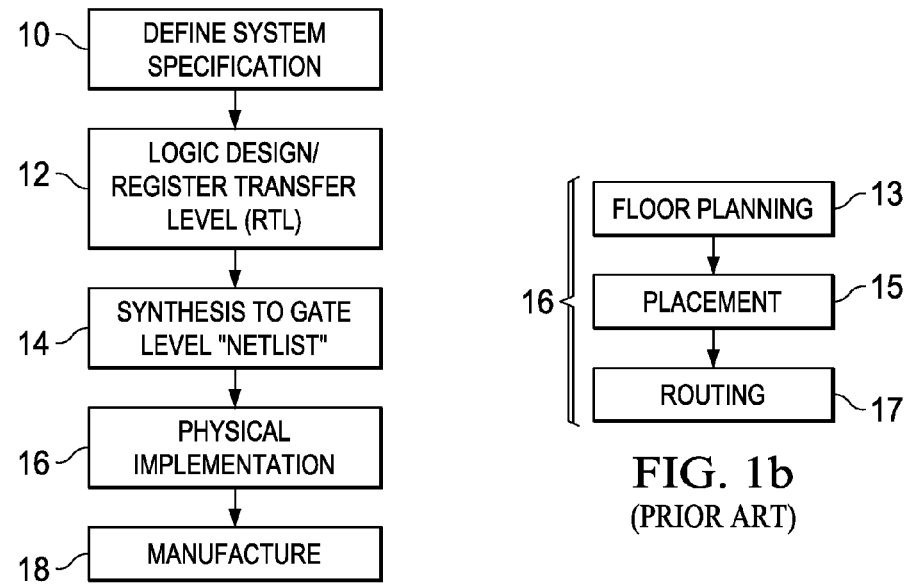
FIG. 1a
(PRIOR ART)
FIG. 1b
(PRIOR ART)
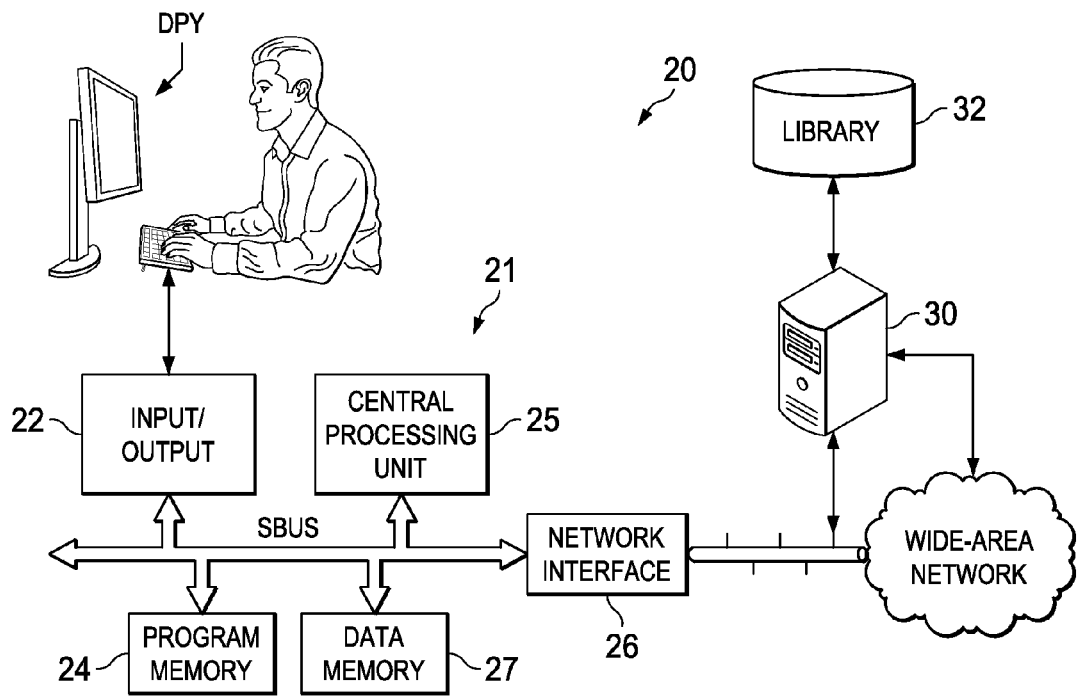
FIG. 2

SYSTEM AND METHOD FOR INTEGRATED CIRCUIT LAYOUT EDITING WITH ASYMMETRIC ZOOM VIEWS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of solid-state integrated circuits. Embodiments of this invention are directed to computer-implemented tools for designing the layout of such integrated circuits.

Advances in semiconductor technology in recent years have enabled the shrinking of minimum device feature sizes, such as metal-oxide-semiconductor (MOS) transistor gates, into the deep sub-micron range. For example, according to some advanced manufacturing technologies as of this date, the target MOS transistor gate width after etch is on the order of 30 nm. This continuing trend toward smaller device sizes, in combination with continuing improvement in manufacturing technology, have enabled the functionality of very large-scale integrated circuits to greatly increase. A single modern integrated circuit can now contain over one billion transistors, with that number expected to continue to increase as still-smaller technology "nodes" become manufacturable. The ability to realize so many active devices in a single integrated circuit has, of course, resulted in the integration of complex functionality into that integrated circuit, including computing resources operating on very wide data words (e.g., sixty-four bits or wider).

As the number of transistors embodied in a single integrated circuit has increased to such levels, the task of designing the integrated circuit to attain the resulting functional complexity has also become quite complex. Also involved in the implementation of such functionality into an integrated circuit is the task of defining the physical position and physical attributes of each active device, passive device, and interconnection among those devices, to such an extent that photomasks can be created to define those elements in each of the various material layers to be involved in the physical construction of the integrated circuit. As known in the art, this task is referred to as "layout".

A conventional approach to facilitating the design and layout of very large scale integrated circuits, particularly such an integrated circuit that is to carry out a specific function (e.g., a particular computational or control function desired by a system manufacturer), is referred to as the "ASIC" ("Application-Specific Integrated Circuit") design flow. According to this approach, the integrated circuit layout appears as multiple previously-designed and laid-out circuit blocks (i.e., standard cells) for specific functions, memories, and input/output cells arranged in a somewhat regular grid within the rectangular boundaries of the integrated circuit. Interconnections among the various standard cells, I/O blocks, and memories reside in overlying conductor layers.

As known in the art, the ASIC design flow now typically uses commercially-available design tools to convert a system specification into a data file (e.g., the "pattern generation" or "PG" file) from which photomasks can be constructed for manufacture of the integrated circuit. FIG. 1a is a somewhat simplified high-level flow diagram illustrating a typical conventional ASIC design flow. In process 10, the system specifications are defined by the design team. These specifications of course include the desired functionality and performance of the integrated circuit, as well as any constraints (e.g., maximum chip area, power dissipation). In addition, process 10 identifies the manufacturing technology to be used in the manufacture of the integrated circuit (e.g., twin-well CMOS), including the minimum device sizes available for the technology. The specifications defined in process 10 also include functional and architectural specifications, such as the class of instruction set to be implemented (e.g., RISC or CISC), functional features such as pipelining and the number of "cores" for processing units in the integrated circuit. Typical functional and architectural specifications for modern ASICs also break down the overall functionality into various subchips, and identify the relationship between those subchips and the overall, "top-level", system.

These system specifications defined in process 10 serve as the input for logic design process 12. This process 12 implements the system specification into a logic representation of the integrated circuit, for example at a level including sequential or combinatorial logic, Boolean expressions, registers, and the like. This logic representation is typically expressed in a "hardware description language" ("HDL"), as known in the art. Verification that the resulting HDL expression of the integrated circuit corresponds to the higher-level system specifications is typically performed.

In this high-level ASIC flow, the HDL expression of the integrated circuit is then converted into a "gate level netlist" by way of logic synthesis process 14. Conventional synthesis tools are available in the industry to assist the design team in carrying out synthesis process 14. As known in the art, these synthesis tools receive the HDL representation, along with the desired library of "standard cells" available for use in the design, and creates a list of the interconnections, at the gate level, between the various logic functions in the device. Cost constraints are generally applied in synthesis process 14, so that an optimal netlist for a particular manufacturing technology and process can be selected. Typically, in a standard cell ASIC design, the netlist is a complete structural description of the integrated circuit, with each "net" referring to an interconnection among two or more standard cell nodes (or an input/output pad). Simulation can be applied to this structural description, to verify the logic design and perhaps to confirm high level performance.

Physical implementation process 16 turns the netlist and standard cells from process 14 into a geometric representation of the physical layout of the integrated circuit. The desired result of physical implementation process 16 is a data file (PG file) from which photomasks can be generated for use in defining physical features in the various layers of the selected manufacturing technology, in the manufacture of integrated circuits in process 16.

FIG. 1b illustrates a typical flow for carrying out physical implementation process 16, according to conventional approaches. In a general sense, physical implementation process 16 begins with "floorplanning" the integrated circuit (process 13). Floorplanning process 13 defines the high level arrangement of the physical integrated circuit, including identification of the width and length of the eventual integrated circuit. Modern ASIC layouts arrange the subchips (i.e., standard cells, memory blocks, and I/O functions) according to a gridded ("Manhattan") approach. The routing of power supply voltages is also defined in the floorplanning stage, since each subchip will require at least one power supply voltage and a corresponding ground or reference voltage. The location of input/output blocks and external connections "pads" can also be selected in floorplanning process 13. In placement process 15, the locations of the subchips in the floorplan defined in process 13 are selected. Circuit macros and logic gates within each of those subchips are also arranged and located within the physical floorplan as part of placement process 15.

Following placement process 15 (and any verification desired by the design team), routing process 17 is then carried out to define the geometric placement of interconnections between the subchips as placed in process 13, and of course based on the netlist from logic synthesis process 14. According to conventional ASIC layout techniques, a grid of horizontal and vertical "wiring tracks" overlays the layout of the integrated circuit. As mentioned above, the power and ground buses are assigned to specific tracks, creating power and ground "meshes" in this overlay. The remaining tracks can be used for interconnects between subchips. In this grid arrangement, interconnects are generally constrained to running either in a horizontal or vertical directions along tracks. Typically, one conductor layer is dedicated to horizontal interconnect segments, and another, adjacent, conductor layer is dedicated to vertical interconnect segments; for example, even-numbered conductor layers (e.g., "the metal 2 level") may be dedicated to horizontal interconnect segments in the x-y plane, with odd-numbered conductor layers (e.g., "the metal 3 level") dedicated to vertical segments in that plane. Vias through the intervening insulator layers form connections among the various conductor layers.

Interconnects in an integrated circuit design can be routed manually, typically by a design engineer interactively selecting the routing path for each interconnect in the layout. Manual routing can provide a highly regular pattern of interconnects, with optimal utilization of wiring tracks and routing resources. However, manual routing is a prohibitively time-consuming, expensive, and error-prone task for modern complex integrated circuits, especially those with many subchips and input/output resources, and ultra-wide data word widths. The difficulties of manual routing are exacerbated as the integrated circuit becomes relatively large in chip area, because the routing of long on-chip interconnect distances, the large number of geometries, and the necessarily-occurring irregularities in such large devices complicate the routing problem. Worse yet, a small change in a routing path, or an interconnect line width, can result in a "domino effect", necessitating changes in hundreds of other interconnects beginning with near neighbors. Manual routing has therefore become essentially impractical for integrated circuits of moderate and higher complexity.

At the other end of the spectrum, automated router software packages ("autorouters") are available for carrying out routing process 17 with greatly improved efficiency relative to manual routing. Autorouter tools operate by deriving an interconnect routing that reflects the netlist of the circuit, as applied to the result of placement process 15. However, it has been observed that wiring derived by such automated routing tools typically appears somewhat random, with little regularity exhibited in the interconnect paths. For example, autorouted integrated circuits typically do not include data bus structures, in which parallel interconnects for multiple bits in a data word run largely in parallel between their endpoints. Rather, the individual wires in potential data buses can follow paths that are largely independent of one another. In addition, it has been observed that autorouters tend to under-utilize the available wiring tracks as compared with manual routing efforts. In the worst case, designs having a significant amount of "top-level" wiring, in the form of wide data buses that heavily utilize the available metal resources, often result in the autorouter not converging to a routing solution.

Some design engineers use a combination of manual routing and autorouting to arrive at the layout of interconnections. For example, the design engineer may manually route some of the interconnections, and allow the autorouter to make the rest of the connections, constrained by the manually routed paths. This combination can attain good area efficiency and regularity in many of the interconnections, while avoiding the painstaking routing involved with the remaining more random wires.

By way of further background, my copending and commonly assigned U.S. application Ser. No. 13/297,086 entitled "An Interactive Routing Editor with Symbolic and Geometric Views for Integrated Circuit Layout", filed Nov. 15, 2011 and incorporated herein by reference, describes an automated system and method for interactively routing interconnections in a layout of an integrated circuit. Top level interconnections among subchips in the integrated circuit, specified by a netlist, and that are arranged as a bus, are displayed in a symbolic view by a representative wire of the bus, for example the least-significant or most-significant bit position in the bus. The physical routing of the representative wire is interactively defined, using orthogonal wire segments of the representative wire in selected conductor levels. Bus properties, for example including bit pitch, wire pitch, LSB/MSB (when displayed in the symbolic view), and a direction of expansion, are associated with the routing data for each segment of the representative wire. By combining the routing data and the bus property data, the system can build the entire bus for display in a geometric view.

By way of further background, my copending and commonly assigned U.S. application Ser. No. 13/362,906 entitled "System and Method for Integrated Circuit Layout Editing Using Reference Frames", filed Jan. 31, 2012 and incorporated herein by reference, describes an automated system and method for editing the floorplan, placement, and toplevel wiring routing in a layout of an integrated circuit. Components in the layout of the integrated circuit, such components including functional blocks or subchips, and also wire segments of the toplevel wiring, are associated with horizontal reference frames and vertical reference frames. Each reference frame has its position, in the orthogonal direction, specified by a position of a reference line. The positions of subchips and wire segments within the reference frame are expressed as offsets from the reference line. Movement of components is accomplished by moving the reference frame in the orthogonal direction, and updating the reference line position while maintaining the offset values constant. Floorplan changes performed in this manner, by moving reference frames, are accomplished much more productively than by conventional methods, which require separate readjustment of the locations of a large number of individual wires after subchip movements.

"Zooming" of the displayed view of an integrated circuit layout is accomplished by conventional routing and layout editors in several customary ways. One common approach operates by the user first invoking the zoom-in function, for example by way of a keystroke (e.g., the "z" key) or pull-down menu selection, and then selecting a rectangular area on the screen by way of mouse clicks (e.g., on opposite corners of the rectangle). The editing system then magnifies the layout view so that the larger dimension of the selected rectangular area fills its corresponding dimension in the current window presented at the graphics display. The layout in the other dimension is magnified by the same magnification factor as the first; the resulting display may not correspond to the selected rectangle in that dimension, however, depending on the aspect ratio of the graphics display or current window. Other approaches can involve the invocation of a fixed-magnification zoom-in keystroke (e.g., alt-"i" corresponding to a 2× magnification). Zooming out (i.e., expanding the view, or reducing the magnification) can be done in similar fashion: invoking a zoom-out command and then drawing a small rectangular area into which the current view is compressed along the larger dimension to fit. Alternatively, a keystroke combination may be defined for execution of a 2× zoom-out.

However, in complex very-large-scale integrated circuits such as ASICs, the length of many of the top-level metal conductors is extremely long as compared with the nominal conductor width. For example, a top-level metal conductor having a width of on the order of one micron may have a length extending for several millimeters, and in some cases up to on the order of one centimeter. The design engineer editing the routing of top-level interconnects is often concerned both with the ultimate source and destination of the conductor and with the particular wiring track occupied by the conductor, and is thus interested in the run of the conductor in both orthogonal directions.

This huge disparity of dimensions in the x- and y-directions of the layout has rendered manual routing and editing cumbersome. In layouts with that disparity, conventional zooming of the layout view is at best partially effective to the design engineer carrying out manual routing of top-level conductors, or editing of that routing. For example, to view the wiring track occupied by a single conductor in a wide bus, the design engineer must zoom-in the view quite closely, applying a large magnification. But because this large magnification is applied to both the x- and y-dimensions of the displayed portion of the layout, the design engineer is not able to simultaneously see both individual wiring tracks and the entire run of the conductor. To then follow a particular conductor over its length, the design engineer must either scroll or page the view many times in the orthogonal direction to cover the length of the conductor, or zoom the displayed view back out again (losing sight of the individual conductor of interest). In any case, conventional layout editors are not well-suited for fast and efficient analysis and editing of top-level conductors with dimensional disparity to that extent. Worse yet, many ASIC and other large-scale chip projects organize their top-level conductors as buses with wide bit widths (e.g., as wide as 128 bits); these large numbers of bus conductors will generally run in parallel and in close proximity with one another (e.g., adjacent wiring tracks) over much of their routing. The ability to distinguish closely-spaced and tightly-packed bus lines of narrow width running over long distances is thus even more difficult.

BRIEF SUMMARY OF THE INVENTION

Embodiments of this invention provide a method and corresponding system that facilitates the editing of integrated circuit layouts, particularly relative to features that extend many times farther in one dimension than in the orthogonal dimension.

Embodiments of this invention provide such a method and system that enables efficient and accurate interconnection of subchip components and top-level wiring.

Embodiments of this invention provide such a method and system that reduces errors in subchip and wiring placement.

Embodiments of this invention provide such a method and system that can be readily and efficiently invoked during the layout and layout editing process.

Other objects and advantages of embodiments of this invention will be apparent to those of ordinary skill in the art having reference to the following specification together with its drawings.

An embodiment of this invention may be implemented into a computer system, and method of operating a computer system, for assisting the routing and editing of integrated circuit features such as top-level interconnections in the integrated circuit. According to an embodiment of the invention, the user invokes an asymmetric zoom command in combination with a selection of the dimension of the zoom and the magnification in that dimension. The system will respond by magnifying (either >1 or <1 magnification, depending on the command) the view along the selected dimension, while maintaining the current view of the layout in the other dimension.

BRIEF DESCRIPTION OF THE SEVERAL VIEWS OF THE DRAWING

FIGS. 1a and 1b are flow diagrams illustrating a conventional design and layout flow for an application specific integrated circuit (ASIC).

FIG. 2 is an electrical diagram, in block form, of a design and layout automation system programmed to facilitate layout of an integrated circuit according to embodiments of the invention.

DETAILED DESCRIPTION OF THE INVENTION

Figure 3:
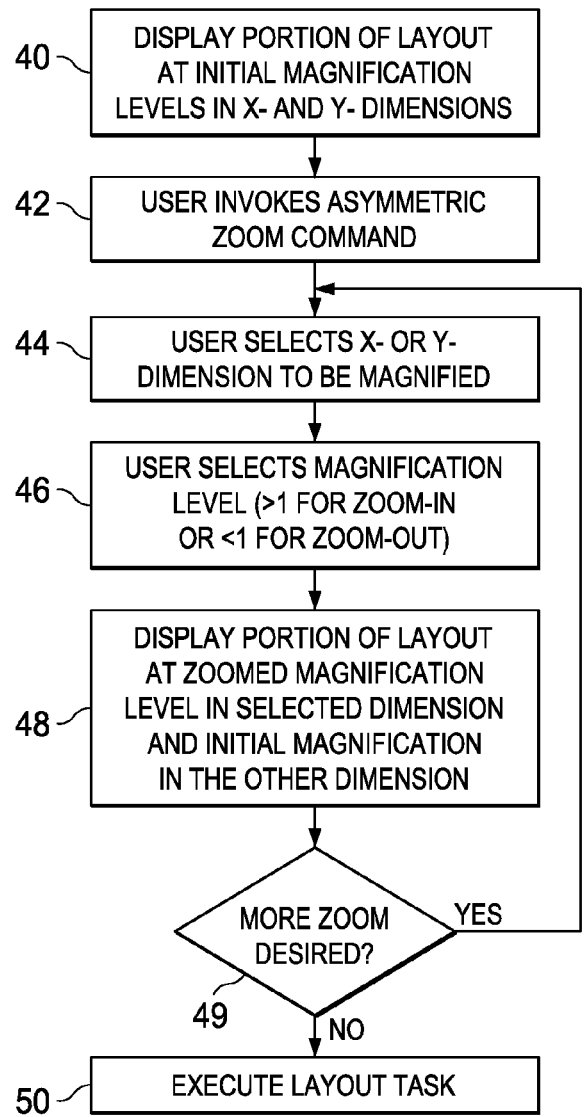
FIG. 3 is a flow diagram illustrating the operation of the system of FIG. 2 in an overall design and layout flow according to embodiments of the invention.

This invention will be described in connection with one or more of its embodiments, namely as implemented into a networked computer system used in the design and layout of an application specific integrated circuit (ASIC), because it is contemplated that the invention will be especially beneficial in such an application. However, it is also contemplated that invention will be useful and beneficial if applied to other design and layout tasks, for other types of devices. Accordingly, it is to be understood that the following description is provided by way of example only, and is not intended to limit the true scope of this invention as claimed.

Design and Layout Automation System

Referring now to FIG. 2, a networked example of design and layout automation system 20 as useful in generating a layout of a VLSI integrated circuit according to embodiments of this invention, will now be described. In this example, system 20 is as realized by way of a computer system including workstation 21 connected to server 30 by way of a network. Of course, the particular architecture and construction of a computer system useful in connection with this invention can vary widely. For example, system 20 may be realized by a single physical computer, such as a conventional workstation or personal computer, or alternatively by a computer system implemented in a distributed manner over multiple physical computers. Accordingly, the generalized architecture illustrated in FIG. 2 is provided by way of example only.

As shown in FIG. 2, workstation 21 includes central processing unit 25, coupled to system bus SBUS. Also coupled to system bus SBUS is input/output interface 22, which refers to those interface resources by way of which a keyboard, a pointing device (mouse, trackball, etc.), display DPY, and other peripheral functions interface with the other constituents of workstation 21. Central processing unit 25 refers to the data processing capability of workstation 21, and as such may be implemented by one or more CPU cores, co-processing circuitry, and the like. The particular construction and capability of central processing unit 25 is selected according to the application needs of workstation 21, such needs including, at a minimum, the carrying out of the functions described in this specification, and also including such other functions as may be desired to be executed by system 20. In the architecture of system 20 according to this example, program memory 24 and data memory 27 are coupled to central processing unit 25 by way of system bus SBUS.

Program memory 24 stores the computer instructions to be executed by central processing unit 25 in carrying out those functions. More specifically, program memory 24 is a computer-readable medium storing executable computer program instructions according to which the operations described in this specification are carried out by system 20, specifically by central processing unit 25 of workstation 21. Alternatively, these computer program instructions may be stored at and executed by server 30, in the form of a "web-based" application, upon input data communicated from workstation 21, to create output data and results that are communicated to workstation 21 for display or output in a form useful to a human user. Data memory 27 provides memory resources of the desired type useful as data memory for storing input data and the results of processing executed by central processing unit 25. Of course, this memory arrangement is only an example, it being understood that data memory 27 and program memory 24 may be included within a unified physical memory resource, or distributed in whole or in part outside of workstation 21.

Network interface 26 of workstation 21 is a conventional interface or adapter by way of which workstation 21 accesses network resources on a network. As shown in FIG. 2, the network resources to which workstation 21 has access via network interface 26 includes server 30, which resides on a local area network, or a wide-area network such as an intranet, a virtual private network, or over the Internet, and which is accessible to workstation 21 by way of one of those network arrangements and by corresponding wired or wireless (or both) communication facilities. In this embodiment of the invention, server 30 is a computer system, of a conventional architecture similar, in a general sense, to that of workstation 21, and as such includes one or more central processing units, system buses, and memory resources, network interface functions, and the like.

Library 32 is also available to server 30 (and perhaps directly accessible to workstation 21 over the local area or wide area network), and stores previously generated design data for the integrated circuit under design. For example, following the conventional ASIC design flow as described above in connection with FIGS. 1a and 1b, the design data for the integrated circuit being designed include the system specifications of that integrated circuit, the hardware description language (HDL) register level description of the integrated circuit, a netlist generated by conventional logic synthesis, data indicative of the floor-planning and placement of subchips at locations of the integrated circuit, design rules, and the like, and the routing of interconnections among those subchips (i.e., the "top-level" wiring). Additional detail regarding the design data upon which system 20 operates according to embodiments of this invention will be described below. Library 32 may instead or additionally reside on another local area network, or alternatively be accessible via the Internet or some other wide area network. It is contemplated that library 32 may also be accessible to other associated computers in such an overall network, so that other personnel in the design team can simultaneously be carrying out other tasks in connection with this integrated circuit.

Of course, the particular memory resource or location at which library 32 and program memory 24 physically reside can be implemented in various locations accessible to system 20. For example, these data and program instructions may be stored in local memory resources within workstation 21, within server 30, or in remote memory resources that are network-accessible to these functions. In addition, each of these data and program memory resources can itself be distributed among multiple locations, as known in the art. It is contemplated that those skilled in the art will be readily able to implement the storage and retrieval of the applicable information useful in connection with this embodiment of the invention, in a suitable manner for each particular application.

According to this embodiment of the invention, by way of example, program memory 24 stores computer instructions executable by central processing unit 25 to carry out the functions described in this specification, by way of which the physical layout of subchips and top-level interconnects in the layout of the integrated circuit under design can be designed and edited. More specifically, these functions pertain to the manner in which portions of the layout of the integrated circuit are displayed at display DPY during such layout design and editing, particularly to implement a zoom function that applies a different magnification in one dimension (i.e., parallel to one axis of the display) than in the other. These computer instructions may be in the form of one or more executable programs, or in the form of source code or higher-level code from which one or more executable programs are derived, assembled, interpreted or compiled. Any one of a number of computer languages or protocols may be used, depending on the manner in which the desired operations are to be carried out. For example, these computer instructions may be written in a conventional high level language, either as a conventional linear computer program or arranged for execution in an object-oriented manner. These instructions may also be embedded within a higher-level application.

It is contemplated that those skilled in the art having reference to this description will be readily able to realize, without undue experimentation, this embodiment of the invention in a suitable manner for the desired installations. Alternatively, these computer-executable software instructions may be resident elsewhere on the local area network or wide area network, or downloadable from higher-level servers or locations, by way of encoded information on an electromagnetic carrier signal via some network interface or input/output device. The computer-executable software instructions may have originally been stored on a removable or other non-volatile computer-readable storage medium (e.g., a DVD disk, flash memory, or the like), or downloaded as encoded information on an electromagnetic carrier signal, for example in the form of a software package from which the computer-executable software instructions were installed by system 20 in the conventional manner for software installation.

Operation of the Asymmetric Zoom Function

Embodiments of this invention are directed to the operation of system 20 in designing a physical layout of a VLSI integrated circuit, such as an application specific integrated circuit (ASIC). As will become evident from the following description, embodiments of this invention may be applied to the layout of integrated circuits of essentially any size or complexity, including the billion-transistor ASICs now being commonly produced in the industry. Embodiments of this invention especially facilitate the routing of top-level wiring among the functional blocks (i.e., subchips) placed in the floorplan of the layout of such highly complex VLSI integrated circuits, both in the original routing (process 17 of FIG. 1b) and in the editing and rearrangement of such routing to effect late-stage modifications to existing floorplanning and routing.

As discussed above in the Background of the Invention, the large potential disparity between the lengths of some top-level metal conductor wire segments and their widths renders the routing and editing process cumbersome. Conventional symmetric zooming of the layout in a window at display DPY is not capable of viewing the detailed placement of wire segments in the available wiring "tracks" in the layout, while also viewing the run of that wire segment from endpoint to endpoint. As such, the design engineer must follow a particular conductor over its length by repeatedly scrolling or paging the displayed portion of the layout. Routing tasks become especially tedious as a result, especially in those ASIC and other large-scale integrated circuit layouts in which these top-level conductors as arranged as wide-bit-width buses of closely-spaced conductors. A low magnification view of such a bus, as is often necessary to view the length of the conductor using conventional layout systems, will be unable to resolve individual bit conductors and their assignment to corresponding wiring tracks.

FIG. 3 illustrates a processing flow according to which embodiments of this invention interactively implement an asymmetric zoom function in the presentation of a portion of the layout of the integrated circuit at display DPY. It is contemplated that the procedure shown in FIG. 3 and described herein will generally be most applicable in the routing of top-level conductors, as those elements of the integrated circuit are most likely to have dimensions that are much larger in one dimension than in the other (e.g., by as many as four orders of magnitude, in modern integrated circuits). As such, embodiments of this invention will generally make reference to implementation within routing process 17 in the design methodology described above relative to FIGS. 1a and 1b. However, it is contemplated that embodiments of this invention may also be applicable to other steps in physical implementation process 16 for the integrated circuit, including floorplanning process 13 and placement process 15.

By way of further context, routing process 17 may be carried out manually, using an automatic routing software package ("autorouter"), or by some combination of the two. A particularly useful routing editor and method is described in my copending and commonly assigned U.S. application Ser. No. 13/297,086 entitled "An Interactive Routing Editor with Symbolic and Geometric Views for Integrated Circuit Layout", filed Nov. 15, 2011 and incorporated herein by reference. In any case, during the routing of toplevel wiring in process 17, or in further editing of that routing, it may become useful for the design engineer to more closely analyze the routing of a particular wire segment over its length, maintaining visibility of its endpoints.

The asymmetric zoom function available during routing process 17 according to embodiments of this invention begins, as shown in FIG. 3, with process 40 in which system 20 displays, at display DPY, a selected portion of the layout of the integrated circuit, in a current "window" (i.e., a rectangular area presented by display DPY including content that is independent of the content at other portions of display DPY). For purposes of this description, the initial display of the layout in process 40 is at an initial magnification level (initial, for purposes of the asymmetric zoom function), with that same initial magnification level pertaining to both axes (x- and y-dimensions). As conventional in the art, the desired initial magnification level can be attained by the user (i.e., the design engineer or other person arranging the layout of the integrated circuit) selecting a center location of the display, and zooming the magnification in both dimensions to the desired initial magnification level.

Figure 4A:
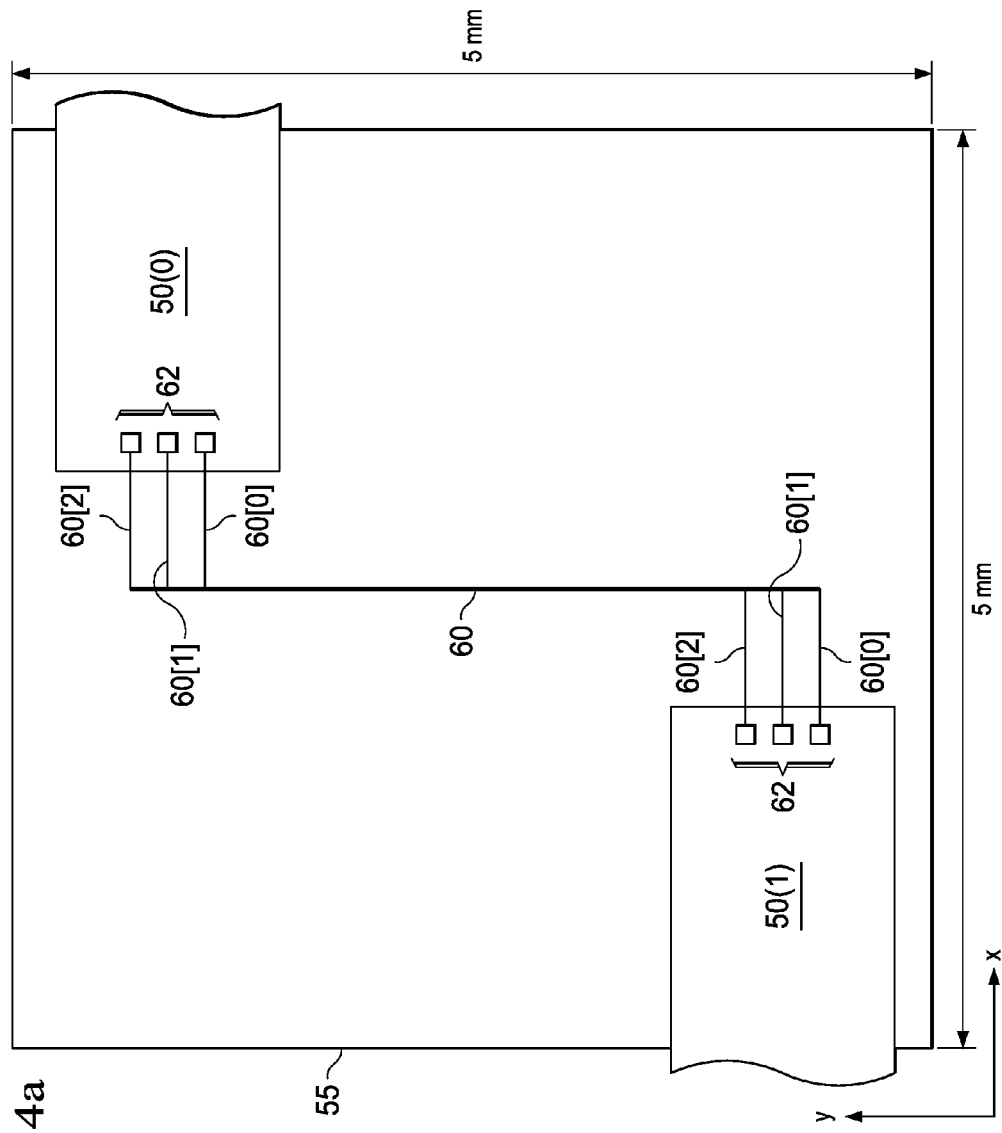
FIGS. 4a through 4e are plan views of portions of the layout of an integrated circuit, illustrating an example of the operation of embodiments of the invention.

FIG. 4a illustrates, in plan view, a portion of the layout of an integrated circuit, in simplified form, as an example of the initial display generated in process 40 to illustrate the operation of the procedure shown in FIG. 3 according to embodiments of this invention. As shown in FIG. 4a, the selected portion of the integrated circuit displayed in window 55 by process 40 is at an initial magnification level that represents an area that is 5 mm on a side, and includes bus 60 connected between corresponding terminals 62 at each of subchips 50(0) and 50(1). Bus 60 includes, in this simplified example, three wires 60[0], 60[1], 60[2]. As mentioned above, many signal buses within modern large-scale integrated circuits will include many more individual wires, numbering as many as 128 wires in some implementations. For purposes of this description, adjacent horizontally-running segments of wires 60[0], 60[1], 60[2] have relatively large spacing in the vertical direction (along the y-axis in FIG. 4a) at subchips 50(0), 50(1). However, vertically-running segments of wires 60[0], 60[1], 60[2] are closely spaced relative to one another, so much so as to be indistinguishable at the initial magnification level selected for display in process 40.

In this example, the design engineer wishes to view the individual wiring tracks occupied by the vertically-running segments of wires 60[0], 60[1], 60[2] in the view of FIG. 4a, for example to edit the routing of one of those segments. But according to conventional systems and methods, the conventional zoom command would increase the magnification in both the x- and y-dimensions. Any significant additional magnification along the y-axis would cause one or both subchips 50(0), 50(1) to no longer be displayed within window 55. As such, the design engineer would be forced to scroll or page along the y-dimension to view the endpoints of those vertical wire segments, one at a time. Embodiments of this invention address this need by providing an asymmetric zoom command and capability.

In the procedure shown in FIG. 3, the user of system 20 invokes the asymmetric zoom command in process 42. In process 44, the user selects which of the two dimensions (x-dimension or y-dimension) is to receive a change in its magnification level, and the user selects the magnification level to be applied to the selected dimension in process 46. According to embodiments of this invention, the asymmetric zoom may be applied to zoom in along the selected dimension in which case the selected magnification level would be greater than one; an asymmetric zoom out can also be applied along the selected dimension, in which case the selected magnification level would be less than one. In some embodiments of the invention, asymmetric zoom out along a dimension is limited to reducing the magnification only to the current magnification along the orthogonal axis (i.e., to a horizontal to vertical magnification ratio of 1:1), and as such is only available after asymmetric zoom-in has been applied.

It is contemplated that the manner in which processes 42, 44, 46 are performed at system 20 can vary among several alternatives. Indeed, as now common in many workstation-level applications, multiple ways of invoking a command may be simultaneously provided. One approach for performing processes 42, 44, 46 is the use of pull-down menus, in which the user pulls down a list of commands (e.g., from a "view" top-level pull-down tab), one of which corresponds to asymmetric zoom (process 42). Once the command is invoked, a window or wizard may appear, by way of which the user could select the axis to be magnified (process 44), and enter or select the magnification level (process 46). This pull-down menu approach may alternatively be realized by way of a nested pull-down, in which the axis and magnification level options appear (e.g., by way of a right-arrow) as the user selects or hovers over the asymmetric zoom command in the list appearing from the top-level pull-down tab. Other approaches of implementing a pull-down menu invocation of the asymmetric zoom will be apparent to those skilled in the art having reference to this specification.

Alternatively or additionally, certain keystrokes or combinations of keystrokes may be available for invocation of asymmetric zoom. In one approach, separate keystrokes or combinations could be assigned to processes 42 through 46; in that case, the keystrokes for the later selections (processes 44, 46) may become available only after keystroke-enabled invocation of asymmetric zoom in process 42. For example, one keystroke (e.g., alt-"z") could be used to invoke asymmetric zoom in process 42, followed by a second keystroke (e.g., alt-"x" or alt-"y") to select the axis of magnification in process 44, and a third keystroke (e.g., alt-"2", or alt-shift-"2") to select the magnification level along the selected axis (200% and 50%, respectively) in process 46. Further in the alternative, a single keystroke combination (e.g., alt-"i" and alt-shift-"i") could signify a fixed (200%) asymmetric zoom along one dimension (x- and y-dimensions, respectively), thus combining processes 42, 44, 46. In any case, it is contemplated that the order in which processes 42, 44, 46 are performed or invoked may vary from the example shown in FIG. 3 and described above.

Another approach for carrying out processes 42, 44, 46 utilizes the graphical user interface (GUI) of system 20. According to this example, the user would invoke the asymmetric zoom command in process 42 by way of a keystroke or pull-down menu, as before. But in this implementation, processes 44, 46 select the desired axis of magnification and the magnification level by way of a rectangle selected by the user via a mouse or other pointing device, and display DPY.

Figure 4B:
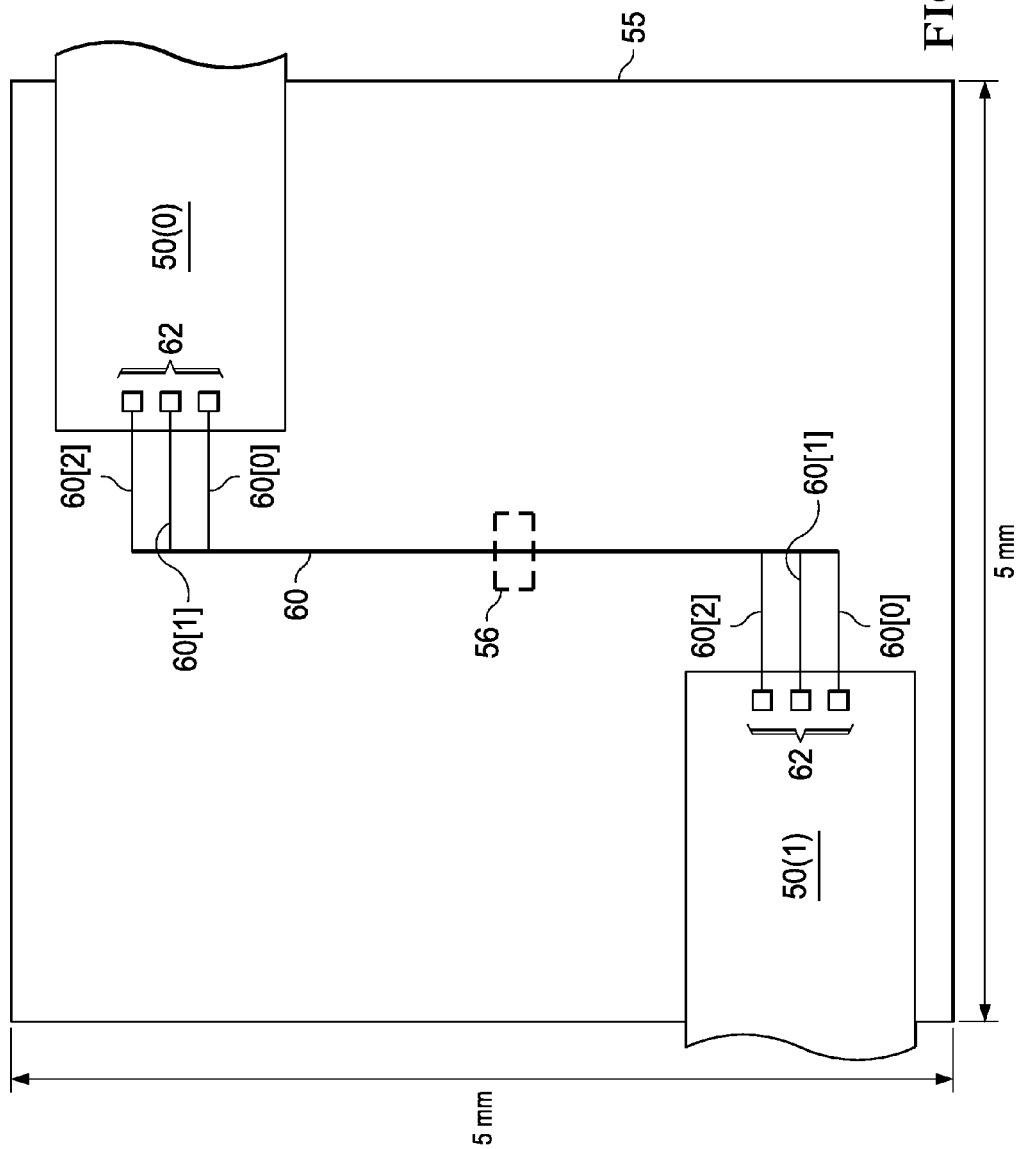

FIG. 4b illustrates an example of this GUI-based zoom axis and magnification selection, relative to the portion of the integrated circuit displayed in window 55 of display DPY shown in FIG. 4a. In this example, the user has previously invoked the asymmetric zoom command (process 42). In processes 44, 46, the user has selected rectangle 56 by way of mouse commands, for example by first clicking one corner of rectangle 56 (e.g., lower-left) and then clicking the opposite corner (e.g., upper-right). As shown in the example of FIG. 4b, rectangle 56 is longer in the x-dimension than it is tall in the y-dimension. According to this embodiment of the invention, this indicates that the x-dimension is the dimension of magnification (process 44). The magnification level to be applied along that selected dimension is determined by the size of rectangle 56 along the selected dimension. More specifically for the example of FIG. 4b, the horizontal bounds of rectangle 56 represents the width (x-dimension) of the layout that is to fill the current window of display DPY as a result of the asymmetric zoom (process 46). The unselected dimension, which is the y-dimension in this example, will remain at its initial magnification level. In other words, for the example of FIG. 4b, the next display of the integrated circuit at display DPY in this window will present a portion of the layout that is magnified along the x-dimension to the bounds of rectangle 56, but which remains at the same magnification in the y-dimension. It is contemplated that the placement of rectangle 56 may also serve to center the displayed portion of the layout following the asymmetric zoom; alternatively, the asymmetrically-zoomed view may remain centered at the same point as originally displayed in process 40, requiring movement of the center point by a separate GUI command (e.g., click-and-drag).

Figure 4C:
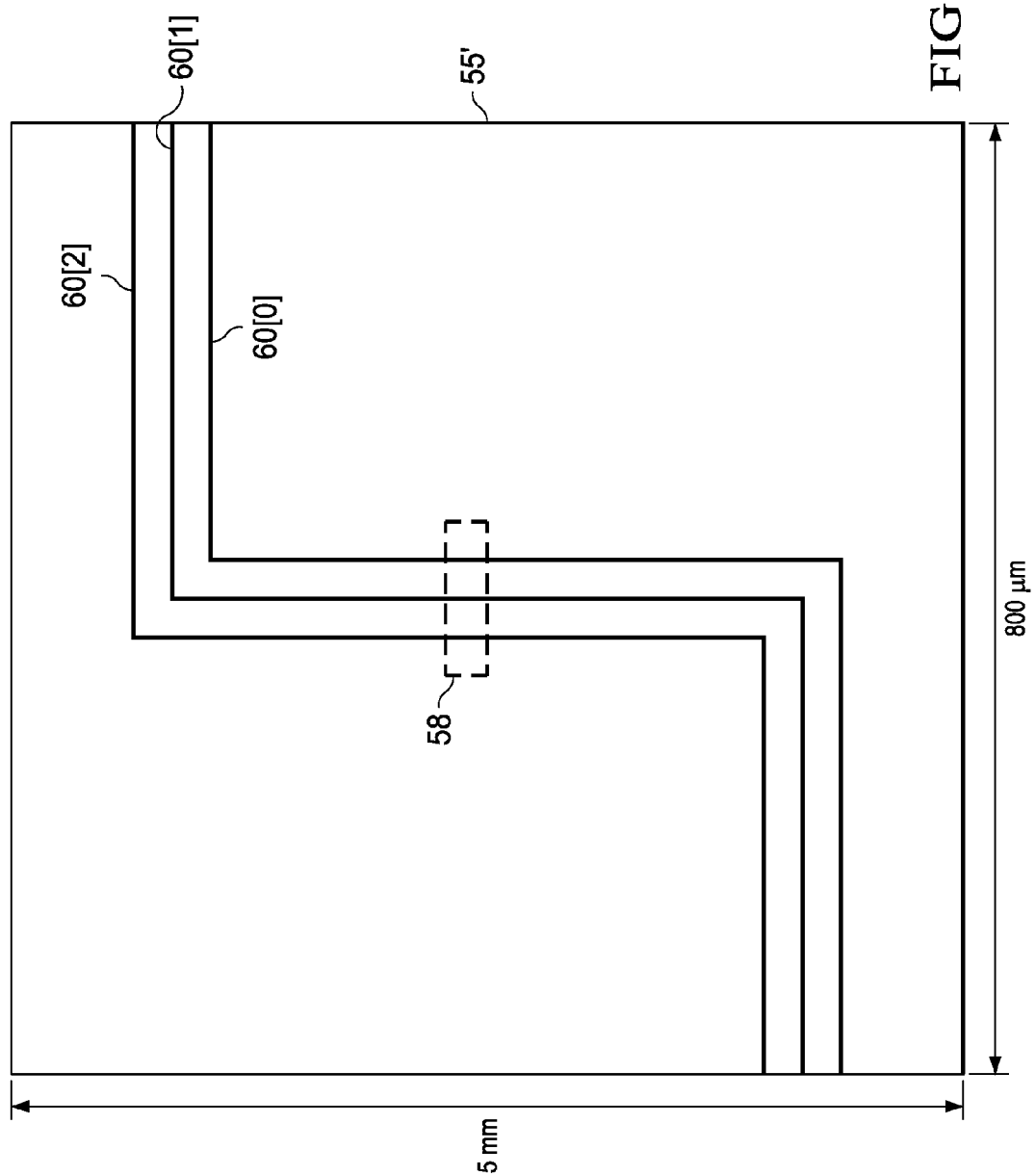

In process 48 (FIG. 3), system 20 then generates a new display of the selected portion of the layout, with the selected magnification along the selected axis, for presentation in the current window at display DPY. FIG. 4c illustrates window 55' resulting from the asymmetric zoom applied by way of rectangle 56 in the example of FIG. 4b, according to an embodiment of the invention. As shown in FIG. 4c, the region of the layout represented in window 55' extends 5 mm in the y-dimension, as shown in FIGS. 4a and 4b, but extends 800 μm in the x-dimension. The asymmetric zoom in this example thus applies an additional magnification of 6.25× (625%) in the x-dimension (i.e., multiplies the initial magnification level by 6.25), but remains at the initial magnification level in the y-dimension. A useful parameter in this connection is a relative magnification factor (e.g., X/Y expand factor); for example, the view of FIG. 4c would have an X/Y expand factor of 6.25. As a result of this asymmetric zoom, the individual vertically-running segments of wires 60[0], 60[1], 60[2] are now visibly distinguishable from one another, while the endpoints of those wires 60[0], 60[1], 60[2] in the y-dimension remain visible (and the vertical separation of the horizontal segments of wires 60[0], 60[1], 60[2] remains as shown in FIGS. 4a and 4b).

Referring back to FIG. 3, decision 49 is then executed by system 20 following the updated display of process 48, to determine whether additional asymmetric zoom is to be applied. If so (decision 49 is "yes"), control returns to process 44, in which the user again selects the dimension to be magnified in a repeated asymmetric zoom, followed by selection of the desired asymmetric magnification level in process 46, and updating of the current window with that next selected asymmetric zoom applied, in process 48.

As evident from the embodiment of the invention shown in FIG. 3 by return of control to process 44, the orthogonal dimension may be selected for magnification in a subsequent instance of asymmetric zoom, if desired by the user, thus reducing the X-Y expand factor. In addition, a different magnification level may be selected in process 46. As such, a great deal of flexibility is provided by this embodiment of the invention. In addition, or alternatively, a keystroke combination (e.g., alt-"i") may be used to simply repeat the previous asymmetric zoom magnification, with the same selected dimension and the same selected magnification level.

Figure 4D:
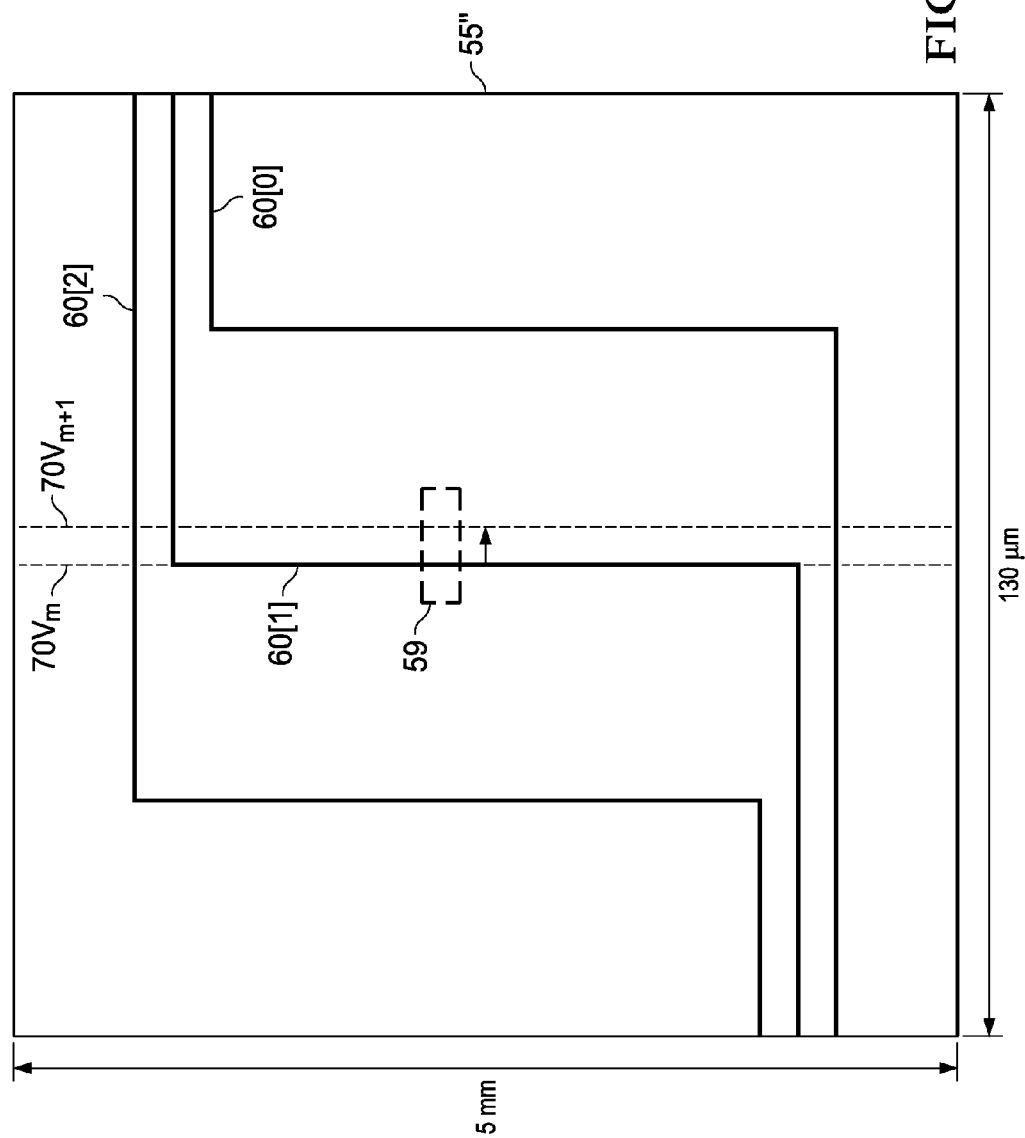
Figure 4E:
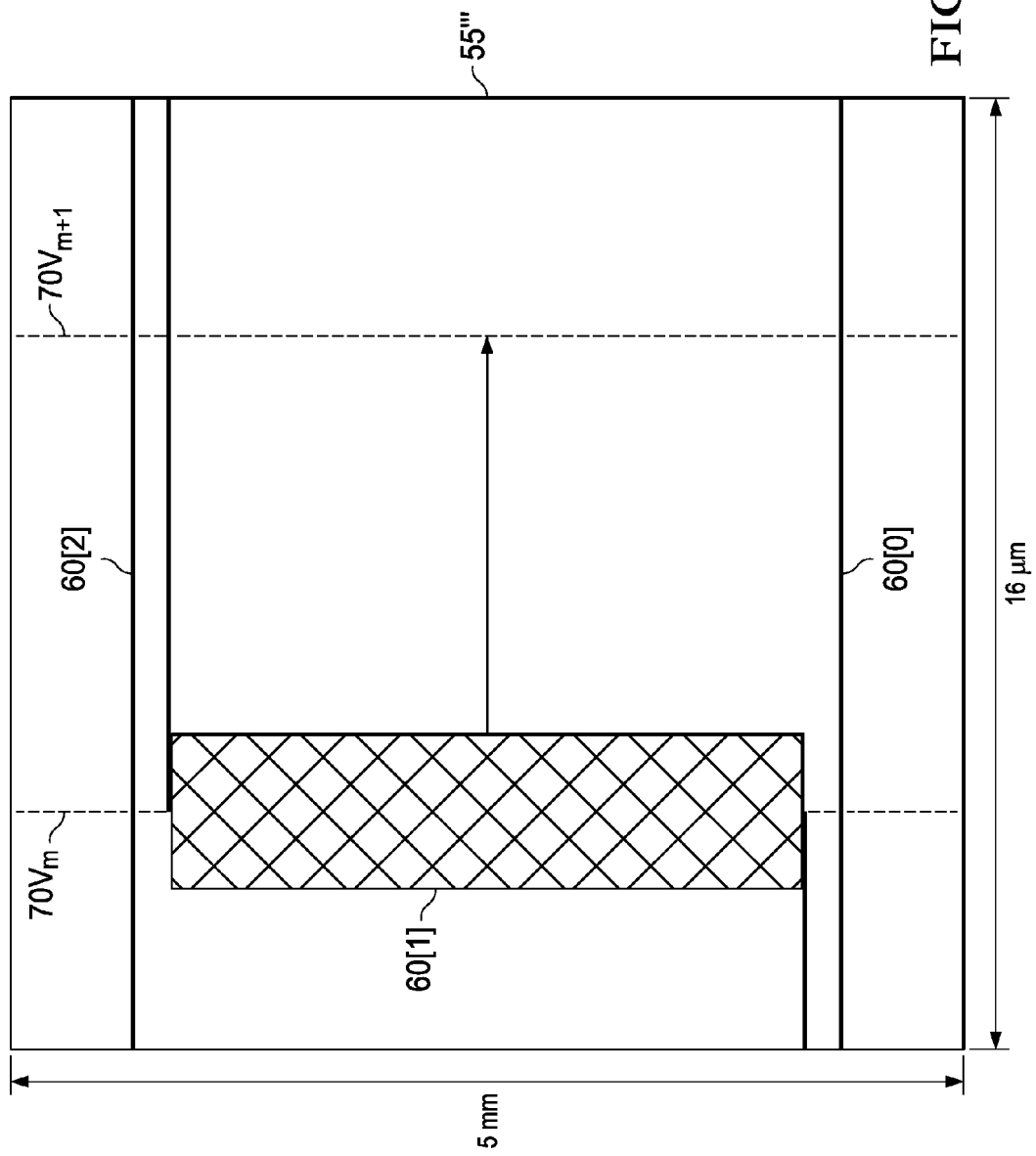

FIGS. 4c through 4e illustrate examples of repeated asymmetric zoom, according to an embodiment of the invention. As shown in FIG. 4c, rectangle 58 has been selected by the user in GUI fashion, again indicating selection of the x-dimension for additional magnification, with the width of rectangle 58 (being larger than its height in the y-dimension) indicating the desired magnification. In this and other repeated asymmetric zoom operations, the determination of which dimension of rectangle 58 is larger (i.e., its width or its length) is based on rectangle 58 as drawn and as seen on display DPY at the time, rather than on the x- and y-lengths of the chip represented by rectangle 58, which are now scaled in relative magnitudes as a result of previous asymmetric zooms. In this example, the result of that next asymmetric zoom is illustrated in FIG. 4d; in this example, an additional 6.2× (620%) magnification is applied in the x-dimension, with the initial magnification level retained for the y-dimension. Window 55" displays a portion of the layout that extends 130 μm in the x-dimension and 5 mm in the y-dimension. The horizontal separation of the vertical segments of wires 60[0], 60[1], 60[2] expands accordingly, but the vertical separation of the horizontal segments of those wires 60[0], 60[1], 60[2] remains the same, both as evident from a comparison of FIGS. 4b and 4c. The X/Y expand factor increases accordingly.

FIG. 4d also illustrates the ability of asymmetric zoom to facilitate editing of layout and routing in the integrated circuit under design. Two vertical signal wiring tracks $70V_m$ and $70V_{m+1}$ are illustrated in FIG. 4d. In this example, as described in the above-incorporated U.S. application Ser. No. 13/297,086 and Ser. No. 13/362,906, vertical segments of toplevel interconnections are routed according to wiring tracks 70V extending in the y-dimension, and horizontal segments of those interconnections are routed along wiring tracks (not shown) extending in the x-dimension. Each wiring track $70V_m$, $70V_{m+1}$ refers to a straight line, along which the centerline of a conductor of a specified pitch (relative to an adjacent conductor at that same "wire pitch") can be placed. In other words, separate isolated interconnections ("wires") may run along adjacent wiring tracks. The spacing of wiring tracks may vary among the various conductor levels of the integrated circuit, according to the manufacturing specifications for different conductor materials to be used in the various layers, for example. Typically, dedicated power and ground wiring tracks are reserved in each level, with the wiring tracks for signal wires interspersed among those power and ground wiring tracks. In the example of FIG. 4d, the vertical segment of wire 60[1] current runs along wiring track $70_m$, but the design engineer wishes to move that segment over to wiring track $70_{m+1}$ if available along the entire length of that vertical segment. The asymmetric zoom provided by embodiments of this invention facilitates such editing, because the individual wiring tracks 70V can be viewed at an increased magnification along the x-dimension, but along the entire length of the run of the desired segment because the y-dimension magnification remains at its initial level.

In the example of FIG. 4d, however, the user wishes to apply another level of asymmetric zoom (decision 49 is again "yes"). This is indicated by rectangle 59 in FIG. 4d, as selected by the user in selecting the dimension and magnification level to be applied in this next asymmetric zoom (processes 44, 46).

FIG. 4e illustrates the results of the next asymmetric zoom in window 55' of display DPY. This asymmetric zoom is in the x-dimension, by a magnification level of about 8× (800%) while maintaining the initial magnification level in the y-dimension. As shown in FIG. 4e, the portion of the layout now displayed in window 55' represents an area of 5 mm in the y-dimension and 16 µm in the x-dimension. And because of this large relative magnification level applied in the x-dimension by the repeated asymmetric zoom operations, the vertical segment of wire 60[1] has a visibly large width, while the visible width of horizontal segments of that wire 60[1] remain as originally displayed (FIG. 4a). However, the design engineer can now readily see that vertical wiring track $70V_{m+1}$ is fully available over the entire desired length of the vertical segment of wire 60[1]. Referring back to FIG. 3, no further asymmetric zoom is now desired by the user (decision 49 is "no"), and editing process 50 can now be performed to move that vertical segment of wire 60[1] over to wiring track $70V_{m+1}$.

As mentioned above, asymmetric zoom may also be invoked by the user to reduce the magnification along a selected dimension. For example, following editing process 50 for the example of FIGS. 4a through 4e, asymmetric zoom may be repeatedly invoked by the user to zoom out in the x-dimension only (i.e., reducing the X/Y expand factor). It may be especially useful for a keystroke combination (e.g., alt-"o") to quickly apply such asymmetric zoom. For convenience, system 20 may limit the application of an asymmetric zoom-out at the point at which the magnification level of the selected dimension matches that of the unselected dimension, at which the X/Y expand factor reaches 1. In the example of FIGS. 4a through 4e, this zooming out of the x-dimension in the view of FIG. 4e can be repeated until the current window 55 again represents an area 5 mm on a side, as in FIG. 4a). Another keystroke combination (or an existing command, such as a "fit to window" command) can be implemented to immediately return the X/Y expand factor to 1, effectively canceling the asymmetric zoom. Further in the alternative, conventional zoom-in and zoom-out (i.e., symmetric zoom) can be applied following an asymmetric zoom operation; such conventional zoom operations would preserve the current X/Y expand factor, changing the magnification level in both dimensions.

Other alternative implementations, particularly in the manner in which the asymmetric zoom function is invoked, can be implemented. For example, the user may select a non-square rectangle (e.g., rectangle 56 in FIG. 4b) first, followed by then invoking the asymmetric zoom command (process 42). It is contemplated that these and other alternatives apparent to those skilled in the art having reference to this specification are within the scope of this invention as claimed.

Embodiments of this invention provide several important advantages in the design and layout of integrated circuits, particularly complex integrated circuits of the ASIC type, and involving many top-level interconnects among multiple subchips within the integrated circuit. As described above, this invention enables the design engineer to finely place and route elements in the layout, such as the routing of signal line wire segments along closely spaced wiring tracks, separated by distances as short as on the order of one micron, while continuing to view the full length of the segment, which may extend for several millimeters. This ability can greatly reduce the tedium and chance for error in physically realizing circuit and interconnection functions in the layout of an integrated circuit, potentially reducing design time and effort.

While this invention has been described according to its embodiments, it is contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A computer-implemented method of defining a physical layout of features in an integrated circuit, comprising the steps of:
    displaying, by using a computer, a first rectangular portion of a physical layout of an integrated circuit, the first rectangular portion at initial magnification levels in a first dimension and in a second dimension orthogonal to the first dimension;
    receiving an asymmetric zoom user command;
    receiving a user selection of the dimension in which the asymmetric zoom is to apply and a zoom magnification level; and
    displaying a second rectangular portion of the layout at a magnification corresponding to the initial magnification level times the zoom magnification level in the selected dimension, and at the initial magnification level in dimension orthogonal to the selected dimension.

2. The method of claim 1, wherein the displaying steps display the rectangular portions of the layout in a current window of a graphical user interface at a graphics display;

wherein the step of receiving a user selection of the dimension and the zoom magnification level comprises:

receiving a user selection of a rectangular region of the displayed first portion, the rectangular region having a longer length in the selected dimension than in the other dimension;

and wherein the step of displaying the second rectangular portion displays the portion of the layout corresponding to the length of the rectangular region in the selected dimension as filling the current window in the selected dimension.

3. The method of claim 1, further comprising:
repeating the receiving and displaying steps;
wherein, in the repeated step of displaying the first rectangular portion, the initial magnification levels correspond to the magnification of the layout as displayed in the previously-displayed second rectangular portion.

4. The method of claim 3, wherein the selected dimension in the repeated step of receiving a user selection of the dimension in which the asymmetric zoom is to apply is the same as the previously selected dimension.

5. The method of claim 3, wherein the selected dimension in the repeated step of receiving a user selection of the dimension in which the asymmetric zoom is to apply differs from the previously selected dimension.

6. The method of claim 1, wherein the step of receiving the user selection of the dimension in which the asymmetric zoom is to apply and the zoom magnification level comprises:

receiving keystroke inputs corresponding to pre-assigned keys indicating the dimension in which the asymmetric zoom is to apply and the zoom magnification level.

7. The method of claim 6, wherein the step of receiving the asymmetric zoom user command comprises receiving a keystroke input corresponding to one or more pre-assigned keys indicating the asymmetric zoom user command.

8. The method of claim 7, wherein the steps of receiving an asymmetric zoom user command and the step of receiving a user selection of the dimension in which the asymmetric zoom is to apply and a zoom magnification level comprises receiving a pre-assigned combination of keystrokes.

9. The method of claim 1, wherein the zoom magnification level is greater than one.

10. The method of claim 1, wherein the zoom magnification level is less than one.

11. The method of claim 1, wherein the features displayed in the first and second rectangular portions correspond to interconnections among a plurality of functional blocks of the integrated circuit.

12. A computer system for interactively defining a physical layout of features in an integrated circuit, the system comprising:

at least one input device for receiving inputs from a system user;
a graphics display;
a processor; and
memory resources, coupled to the processor, including program memory for storing a computer program including program instructions that, when executed by the processor, perform a plurality of operations comprising:

displaying, at the graphics display, a first rectangular portion of a physical layout of an integrated circuit, the first rectangular portion at initial magnification levels in a first dimension and in a second dimension orthogonal to the first dimension; and user command indicating application of an asymmetric zoom in the first dimension, and a zoom magnification level, displaying, at the graphics display, a second rectangular portion of the layout at a magnification corresponding to the initial magnification level times the zoom magnification level in the first dimension, and at the initial magnification level in the second dimension.

13. The system of claim 12, wherein the displaying operations display the rectangular portions of the layout in a current window of a graphical user interface at the graphics display;

and wherein, responsive to also receiving a user selection of a rectangular region of the displayed first portion, the rectangular region having a longer length in the first dimension than in the second dimension, the operation of displaying the second rectangular portion displays the portion of the layout corresponding to the length of the rectangular region in the first dimension as filling the current window in the first dimension.

14. The system of claim 12, wherein the plurality of operations further comprises:

responsive to then receiving, from the at least one input device, an asymmetric zoom user command indicating application of an asymmetric zoom in the first dimension, and a second zoom magnification level, displaying a third rectangular portion of the layout at a magnification corresponding to the magnification level in the first dimension displayed in the second regular portion times the second zoom magnification level, and at the magnification level displayed in the second rectangular portion in the second dimension.

15. The system of claim 12, further comprising:
responsive to then receiving, from the at least one input device, an asymmetric zoom user command indicating application of an asymmetric zoom in the second dimension, and a second zoom magnification level, displaying a third rectangular portion of the layout at a magnification corresponding to the magnification level in the second dimension displayed in the second regular portion times the second zoom magnification level, and at the magnification level displayed in the second rectangular portion in the first dimension.

16. The system of claim 12, wherein the asymmetric zoom user commands selecting the first dimension and the zoom magnification level are received in the form of keystroke inputs corresponding to pre-assigned keys indicating the dimension in which the asymmetric zoom is to apply and the zoom magnification level.

17. The system of claim 16, wherein an asymmetric zoom user command invoking asymmetric zoom is received in the form of a keystroke input of one or more pre-assigned keys indicating the asymmetric zoom user command.

18. The system of claim 7, wherein the user commands invoking asymmetric zoom, selecting the first dimension, and the zoom magnification are received in the form of a keystroke input of a pre-assigned combination of keystrokes.

19. The system of claim 12, wherein the features displayed in the first and second rectangular portions correspond to interconnections among a plurality of functional blocks of the integrated circuit.

20. A non-transitory computer-readable medium storing a computer program that, when executed on a computer system, causes the computer system to perform a sequence of operations for interactively defining a physical layout of features in an integrated circuit, the sequence of operations comprising:

displaying, at a graphics display, a first rectangular portion of a physical layout of an integrated circuit, the first rectangular portion at initial magnification levels in a first dimension and in a second dimension orthogonal to the first dimension; and responsive to receiving an asymmetric zoom user command indicating application of an asymmetric zoom in the first dimension, and a zoom magnification level, displaying, at the graphics display, a second rectangular portion of the layout at a magnification corresponding to the initial magnification level times the zoom magnification level in the first dimension, and at the initial magnification level in the second dimension.

21. The computer-readable medium of claim 20, wherein the displaying operations display the rectangular portions of the layout in a current window of a graphical user interface at the graphics display;

and wherein, responsive to also receiving a user selection of a rectangular region of the displayed first portion, the rectangular region having a longer length in the first dimension than in the second dimension, the operation of displaying the second rectangular portion displays the portion of the layout corresponding to the length of the rectangular region in the first dimension as filling the current window in the first dimension.

22. The computer-readable medium of claim 20, wherein the plurality of operations further comprises:

responsive to then receiving, from the at least one input device, an asymmetric zoom user command indicating application of an asymmetric zoom in the first dimension, and a second zoom magnification level, displaying a third rectangular portion of the layout at a magnification corresponding to the magnification level in the first dimension displayed in the second regular portion times the second zoom magnification level, and at the magnification level displayed in the second rectangular portion in the second dimension.

23. The computer-readable medium of claim 20, further comprising:

responsive to then receiving, from the at least one input device, an asymmetric zoom user command indicating application of an asymmetric zoom in the second dimension, and a second zoom magnification level, displaying a third rectangular portion of the layout at a magnification corresponding to the magnification level in the second dimension displayed in the second regular portion times the second zoom magnification level, and at the magnification level displayed in the second rectangular portion in the first dimension.

* * * * *